United States Patent
Engqvist et al.

(10) Patent No.: US 11,628,503 B2
(45) Date of Patent: Apr. 18, 2023

(54) COATED CUTTING TOOL

(71) Applicant: AB SANDVIK COROMANT, Sandviken (SE)

(72) Inventors: Jan Engqvist, Uppsala (SE); Erik Lindahl, Knivsta (SE)

(73) Assignee: AB Sandvik Coromant, Sandviken (SE)

( * ) Notice: Subject to any disclaimer, the term of this patent is extended or adjusted under 35 U.S.C. 154(b) by 0 days.

(21) Appl. No.: 17/252,944

(22) PCT Filed: Jun. 27, 2019

(86) PCT No.: PCT/EP2019/067147
§ 371 (c)(1),
(2) Date: Dec. 16, 2020

(87) PCT Pub. No.: WO2020/002500
PCT Pub. Date: Jan. 2, 2020

(65) Prior Publication Data
US 2021/0123140 A1 Apr. 29, 2021

(30) Foreign Application Priority Data
Jun. 28, 2018 (EP) .................................. 18180519

(51) Int. Cl.
*B23B 27/14* (2006.01)
*C23C 16/02* (2006.01)
(Continued)

(52) U.S. Cl.
CPC .............. *B23B 27/148* (2013.01); *B23C 5/16* (2013.01); *C23C 16/0272* (2013.01);
(Continued)

(58) Field of Classification Search
CPC ... B23B 27/14; B23B 27/148; B23B 2228/04; B23B 2228/10; C23C 16/36; C23C 16/403
(Continued)

(56) References Cited

U.S. PATENT DOCUMENTS 5,700,569 A * 12/1997 Ruppi ..................... C23C 16/32
428/336
6,333,099 B1 * 12/2001 Strondl ................. C23C 28/042
407/119
(Continued)

FOREIGN PATENT DOCUMENTS

CN  1927513 A  3/2007
CN  102883841 A  1/2013
(Continued)

*Primary Examiner* — Seth Dumbris
(74) *Attorney, Agent, or Firm* — Corinne R. Gorski

(57) ABSTRACT

A coated cutting tool having a substrate and a coating is provided. The coating includes an inner $\alpha$-$Al_2O_3$-multilayer and an outer $\alpha$-$Al_2O_3$-single-layer. The thickness of the inner $\alpha$-$Al_2O_3$-multilayer is less than or equal to 35% of the sum of the thickness of the inner $\alpha$-$Al_2O_3$-multilayer and the thickness of the outer $\alpha$-$Al_2O_3$-single-layer. The sum of the thickness of the inner $\alpha$-$Al_2O_3$-multilayer and the outer $\alpha$-$Al_2O_3$-single-layer is 2-15 µm. The inner $\alpha$-$Al_2O_3$-multilayer consists of alternating sublayers of $\alpha$-$Al_2O_3$ and sublayers of TiCO, TiCNO, AlTiCO or AlTiCNO. The inner $\alpha$-$Al_2O_3$-multilayer can include at least 5 sublayers of $\alpha$-$Al_2O_3$.

14 Claims, 1 Drawing Sheet

(51) Int. Cl.
*C23C 16/32* (2006.01)
*C23C 16/34* (2006.01)
*C23C 16/36* (2006.01)
*C23C 16/40* (2006.01)
*C23C 28/04* (2006.01)
*C23C 28/00* (2006.01)
*B23C 5/16* (2006.01)

(52) U.S. Cl.
CPC .............. *C23C 16/32* (2013.01); *C23C 16/34* (2013.01); *C23C 16/36* (2013.01); *C23C 16/403* (2013.01); *C23C 16/405* (2013.01); *C23C 28/042* (2013.01); *C23C 28/044* (2013.01); *C23C 28/42* (2013.01); *C23C 28/44* (2013.01); *B23B 2228/105* (2013.01)

(58) Field of Classification Search
USPC .................... 51/307, 309; 428/698, 701, 702
See application file for complete search history.

(56) References Cited

U.S. PATENT DOCUMENTS

| | | | |
|---|---|---|---|
| 2008/0050614 A1* | 2/2008 | Holzschuh | C23C 28/042 428/698 |
| 2014/0291036 A1 | 10/2014 | Leicht et al. | |
| 2018/0369926 A1* | 12/2018 | Kodama | B23B 27/1603 |
| 2019/0039148 A1* | 2/2019 | Kubo | B23B 27/16 |

FOREIGN PATENT DOCUMENTS

| | | |
|---|---|---|
| CN | 105463388 A | 4/2016 |
| EP | 1323847 A2 | 7/2003 |
| EP | 1705263 A1 | 9/2006 |
| JP | 2006334759 A | 12/2006 |
| JP | 2010-172989 * | 8/2010 |
| WO | 2006072288 A2 | 7/2006 |
| WO | 2008120185 A1 | 10/2008 |

* cited by examiner

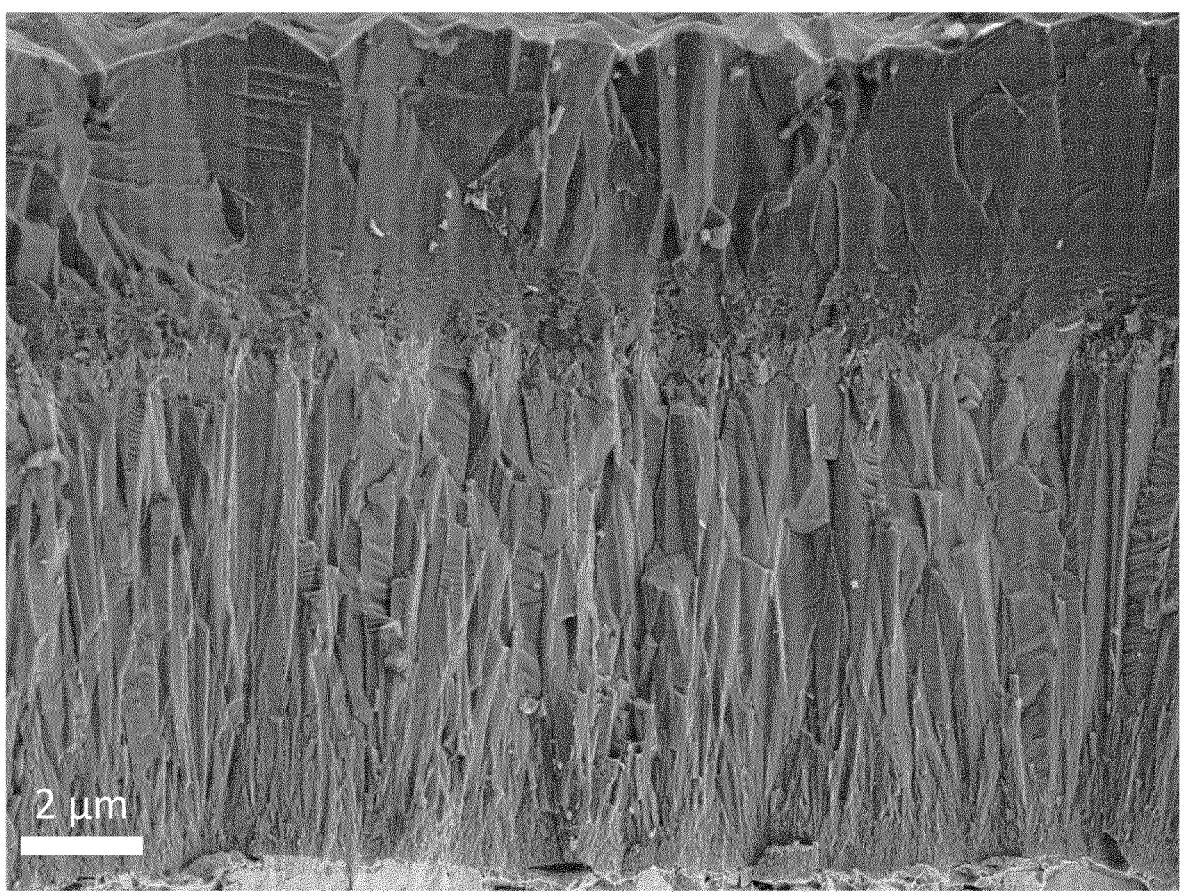

COATED CUTTING TOOL

RELATED APPLICATION DATA

This application is a § 371 National Stage Application of PCT International Application No. PCT/EP2019/067147 filed Jun. 27, 2019 claiming priority to EP 18180519.3 filed Jun. 28, 2018.

TECHNICAL FIELD OF THE INVENTION

The present invention relates to a coated cutting tool comprising a substrate and a coating, wherein the coating comprises an inner $\alpha$-$Al_2O_3$-multilayer and an outer $\alpha$-$Al_2O_3$-single-layer.

BACKGROUND

CVD coatings of aluminum oxide has shown to be advantageous in metal cutting applications and the major part of the CVD coated turning inserts are today provided with a coating of aluminum oxide. The aluminum oxide coatings have over the years been more and more optimized since it has shown that changes of for example grain size and crystal orientation of the aluminum oxide crystals in the coating have a large influence on the wear properties during metal cutting.

There is a continuous need of finding cutting tool coatings that can prolong the life time of the cutting tool and/or that can withstand higher cutting speeds than the known cutting tool coatings.

SUMMARY OF THE INVENTION

One object of the present invention is to provide a coated cutting tool with improved resistance to wear in metal cutting applications. A further object is to improve its resistance in turning operations, especially in turning in steel and hardened steel. It is a further object to provide a wear resistant coating that provides a high crater and flank wear resistance in turning of steel and hardened steel.

The present disclosure relates to a coated cutting tool comprising a substrate and a coating, wherein the coating comprises an inner $\alpha$-$Al_2O_3$-multilayer and an outer $\alpha$-$Al_2O_3$-single-layer, wherein the thickness of the outer $\alpha$-$Al_2O_3$-single-layer is 1-10 µm, preferably 3-5 µm, and wherein the thickness of the inner $\alpha$-$Al_2O_3$-multilayer is less than or equal to 35% of the sum of the thickness of the inner $\alpha$-$Al_2O_3$-multilayer and the thickness of the outer $\alpha$-$Al_2O_3$-single-layer, and wherein said $\alpha$-$Al_2O_3$-multilayer consist of alternating sublayers of $\alpha$-$Al_2O_3$ and sublayers of TiCO, TiCNO, AlTiCO or AlTiCNO, said inner $\alpha$-$Al_2O_3$-multilayer comprises at least 5 sublayers of $\alpha$-$Al_2O_3$.

It has surprisingly been found that a maximum in performance exists for a specific combination of $\alpha$-$Al_2O_3$-multilayer and $\alpha$-$Al_2O_3$-single-layer. This combination provides an increased resistance to flank wear and crater wear. It is believed that the $\alpha$-$Al_2O_3$-single-layer contributes with a high initial crater wear resistance and that the $\alpha$-$Al_2O_3$-multilayer is important for the wear resistance when the cutting edge has started to deform due to wear and heat of the cutting edge.

In one embodiment of the present invention the inner $\alpha$-$Al_2O_3$-multilayer is adjacent to the outer $\alpha$-$Al_2O_3$-single-layer.

In one embodiment of the present invention the sum of the thickness of the inner $\alpha$-$Al_2O_3$-multilayer and the outer $\alpha$-$Al_2O_3$-single-layer is 2-16 µm, preferably 3-8 µm, most preferably 4-6 µm.

In one embodiment of the present invention a period in the inner $\alpha$-$Al_2O_3$-multilayer is 50-900 nm, preferably 70-300 nm, more preferably 70-150 nm, wherein one period is including one sublayer of $\alpha$-$Al_2O_3$ and one sublayer of TiCO, TiCNO, AlTiCO or AlTiCNO.

In one embodiment of the present invention the thickness of the inner $\alpha$-$Al_2O_3$-multilayer is 12% to 35%, preferably 15% to 30%, most preferably 18% to 25%, of the sum of the thickness of the inner $\alpha$-$Al_2O_3$-multilayer and the thickness of the outer $\alpha$-$Al_2O_3$-single-layer.

In one embodiment of the present invention the inner $\alpha$-$Al_2O_3$-multilayer in combination with the outer $\alpha$-$Al_2O_3$-single-layer exhibits an XRD diffraction over a 0-2$\theta$ scan of 20°-140°, wherein the intensity of the 0 0 12 diffraction peak (peak area), I(0 0 12), to the intensities of the 1 1 3 diffraction peak (peak area), I(1 1 3), the 1 1 6 diffraction peak (peak area), I(1 1 6), and the 0 2 4 diffraction peak (peak area), I(0 2 4), is I(0 0 12)/I(1 1 3)>1, I(0 0 12)/I(1 1 6)>1 and I(0 0 12)/I(0 2 4)>1.

In one embodiment of the present invention the inner $\alpha$-$Al_2O_3$-multilayer in combination with the outer $\alpha$-$Al_2O_3$-single-layer exhibits an XRD diffraction over a 0-2$\theta$ scan of 20°-140°, wherein the intensity of the 0 0 12 diffraction peak (peak area), I(0 0 12), to the intensities of the 1 1 3 diffraction peak (peak area), I(1 1 3), the 1 1 6 diffraction peak (peak area), I(1 1 6), and the 0 2 4 diffraction peak (peak area), I(0 2 4), is I(0 0 12)/I(1 1 3)>1, preferably >5, most preferably >8, I(0 0 12)/I(1 1 6)>1, preferably >3, most preferably >5, and I(0 0 12)/I(0 2 4)>1, preferably >2.

In one embodiment of the present invention the intensity of the 0 1 14 diffraction peak (peak area), I(0 1 14), to the intensity of the 0 0 12 diffraction peak (peak area), I(0 0 12), is I(0 1 14)/I(0 0 12)<2, preferably <1.

In one embodiment of the present invention the relation between the intensity of the 1 10 diffraction peak (peak area), I(1 1 0), and the intensities of the 1 1 3 diffraction peak (peak area), I(1 1 3), and the 0 2 4 diffraction peak (peak area), I(0 2 4), is I(110)>each of I(113) and I(024).

In one embodiment of the present invention the relation between the intensity of the 0 0 12 diffraction peak (peak area), I(0 0 12), and the intensity of the 1 1 0 diffraction peak (peak area), I(1 1 0), is I(0 0 12)>I(110).

In one embodiment of the present invention the coated cutting tool comprises at least one layer of TiC, TiN, TiAlN or TiCN located between the substrate and the inner $\alpha$-$Al_2O_3$-multilayer, preferably TiCN.

In one embodiment of the present invention the thickness of the TiC, TiN, TiAlN or TiCN layer is 2-15 µm, preferably 4-10 µm.

In one embodiment of the present invention the coated cutting tool comprises a TiCN layer that exhibits an X-ray diffraction pattern, as measured using CuK$\alpha$ radiation and 0-2$\theta$ scan, wherein the TC(hkl) is defined according to Harris formula:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where I(hkl) is the measured intensity (integrated area) of the (hkl) reflection, $I_0$(hkl) is the standard intensity according to ICDD's PDF-card No. 42-1489, n is the number of reflections, reflections used in the calculation are (1 1 1), (2 0 0), (2 2 0), (3 1 1), (3 3 1), (4 2 0), (4 2 2) and (5 1 1), wherein TC(331)+TC(422)>5, preferably >6.

In one embodiment of the present invention the outermost layer of the coating is said outer α-single-$Al_2O_3$ layer.

In one embodiment of the present invention the substrate is of cemented carbide, cermet, ceramic, high speed steel or cBN.

In one embodiment of the present invention the substrate is of cemented carbide comprising 3-14 wt % Co and more than 50 wt % WC.

The coated cutting tools described herein can be subjected to post-treatments such as blasting, brushing or shot peening in any combination. A blasting post-treatment can be wet blasting or dry blasting for example using alumina particles.

Still other objects and features of the present invention will become apparent from the following definitions and examples considered in conjunction with the accompanying drawings.

BRIEF DESCRIPTION OF DRAWINGS

In the drawings:

FIG. 1 shows a Scanning Electron Microscope (SEM) image of a cross section of an example of the inventive coating, sample MS14.

DEFINITIONS

The term "cutting tool" is herein intended to denote cutting tools suitable for metal cutting applications such as inserts, end mills or drills. The application areas can for example be turning, milling or drilling in metals such as steel.

METHODS

XRD Analysis

In order to investigate the texture or orientation of the layer(s) X-ray diffraction (XRD) was conducted on the flank face using a PANalytical CubiX3 diffractometer equipped with a PIXcel detector. The coated cutting tools were mounted in sample holders to ensure that the flank face of the samples are parallel to the reference surface of the sample holder and also that the flank face is at appropriate height. Cu-Kα radiation was used for the measurements, with a voltage of 45 kV and a current of 40 mA. Anti-scatter slit of ½ degree and divergence slit of ¼ degree were used. The diffracted intensity from the coated cutting tool was measured in the range 20° to 140° 2θ, i.e. over an incident angle θ range from 10 to 70°. The data analysis, including background fitting, Cu-Kα2 stripping and profile fitting of the data, was done using PANalytical's X'Pert HighScore Plus software. The output (integrated peak areas for the profile fitted curve) from this program was then used to define the coating of the present invention in terms of intensity ratios and/or relations.

Normally a so called thin film correction is to be applied to the integrated peak area data to compensate for differences in intensities due to absorption and different path lengths in layers, but since the TiCO, TiCNO, AlTiCO or AlTiCNO sublayer of the present invention are thin and comprise protrusions the thickness of this layer is not trivial to set and the path length through this layer is complex. The orientation of the α-$Al_2O_3$-multilayer in combination with the α-$Al_2O_3$-single-layer is therefore set based on data without thin film correction applied to the extracted integrated peak area intensities for the profile fitted curve. Cu-Kα2 stripping is however applied to the data before the intensity areas are calculated.

Since possible further layers above the outer α-$Al_2O_3$-single-layer will affect the X-ray intensities entering the α-$Al_2O_3$-single-layer and exiting the whole coating, corrections need to be made for these, taken into account the linear absorption coefficient for the respective compound in a layer. Alternatively, a further layer, above the α-$Al_2O_3$-single-layer can be removed by a method that does not substantially influence the XRD measurement results, e.g. chemical etching.

It is to be noted that peak overlap is a phenomenon that can occur in X-ray diffraction analysis of coatings comprising for example several crystalline layers and/or that are deposited on a substrate comprising crystalline phases, and this has to be considered and compensated for by the skilled person. A peak overlap of peaks from the α-$Al_2O_3$ layer with peaks from the TiCN layer might influence measurement and needs to be considered. It is also to be noted that for example WC in the substrate can have diffraction peaks close to the relevant peaks of the present invention.

EXAMPLES

Exemplifying embodiments of the present invention will now be disclosed in more detail and compared to reference embodiments. Coated cutting tools (inserts) were manufactured, analyzed and evaluated in cutting tests.

Sample Overview

Cemented carbide substrates were manufactured utilizing conventional processes including milling, mixing, spray drying, pressing and sintering. The sintered substrates were CVD coated in a radial CVD reactor of Ionbond Type size 530 capable of housing 10.000 half inch size cutting inserts. The ISO-type geometry of the cemented carbide substrates (inserts) were CNMG-120408-PM. The composition of the cemented carbide was 7.2 wt % Co, 2.9 wt % TaC, 0.5 wt % NbC, 1.9 wt % TiC, 0.4 wt % TiN and the rest WC. An overview of the samples is shown in Table 1.

TABLE 1

| Sample overview | |
|---|---|
| Sample | Coating layout above TiN + TiCN + bonding layers |
| MS14 | (α-$Al_2O_3$ + TiCO)$_8$ + α-single-ALOs |
| MS23 | (α-$Al_2O_3$ + TiCO)$_{15}$ + α-single-ALOs |
| S5 | α-single-$Al_2O_3$ |
| M5 | (α-$Al_2O_3$ + TiCO)$_{39}$ + one outermost sublayer of α-$Al_2O_3$ |
| MS-2 | (TiCO + α-$Al_2O_3$)$_2$ + α-single-$Al_2O_3$ |
| MS-4 | (TiCO + α-$Al_2O_3$)$_4$ + α-single-$Al_2O_3$ |

CVD Deposition

A first innermost coating of about 0.4 μm TiN was deposited on all substrates in a process at 400 mbar and 885° C. A gas mixture of 48.8 vol % $H_2$, 48.8 vol % $N_2$ and 2.4 vol % $TiCl_4$ was used.

Thereafter an about 6.5 μm thick TiCN was deposited in two steps, an inner TiCN and an outer TiCN.

The inner TiCN was deposited for 10 minutes at 55 mbar at 885° C. in a gas mixture of, 3.0 vol % $TiCl_4$, 0.45 vol % $CH_3CN$, 37.6 vol % $N_2$ and balance $H_2$.

The outer TiCN was deposited at 55 mbar at 885° C. in a gas mixture of 7.8 vol % $N_2$, 7.8 vol % HCl, 2.4 vol % $TiCl_4$, 0.65 vol % $CH_3CN$ and balance $H_2$.

On top of the MTCVD TiCN layer a 1-1.5 μm thick bonding layer was deposited at 1000° C. by a process consisting of four separate reaction steps.

First a HTCVD TiCN was deposited at 400 mbar, using a gas mixture of 1.5 vol % $TiCl_4$, 3.4 vol % $CH_4$, 1.7% HCl, 25.5 vol % $N_2$ and 67.9 vol % $H_2$.

The three next steps were all deposited at 70 mbar. In the first (TiCNO-1) a gas mixture of 1.5 vol % $TiCl_4$, 0.40 vol % $CH_3CN$, 1.2 vol % CO, 1.2 vol % HCl, 12.0 vol % $N_2$ and balance $H_2$ was used. The next step (TiCNO-2) used a gas mixture of 3.1 vol % $TiCl_4$, 0.63 vol % $CH_3CN$, 4.6 vol % CO, 30.6 vol % $N_2$ and balance $H_2$. In the last bonding layer step (TiN) a gas mixture of 3.2 vol % $TiCl_4$, 32.3% vol % $N_2$ and 64.5 vol % $H_2$ was used.

Prior to the start of the subsequent $Al_2O_3$ nucleation, the bonding layer was oxidized for 4 minutes in a mixture of $CO_2$, CO, $N_2$ and $H_2$.

On all samples, an $\alpha$-$Al_2O_3$-layer was deposited on top of the bonding layer at 1000° C. and 60 mbar in two steps. The first step contained a gas mixture of 1.2 vol % $AlCl_3$, 4.7 vol % $CO_2$, 1.8 vol % HCl and balance Hz, and a second step contained a gas mixture of 1.2 vol % $AlCl_3$, 4.7 vol % $CO_2$, 2.9 vol % HCl, 0.58 vol % $H_2S$ and balance $H_2$. On the so-called MS samples (Multi+Single samples) and the M samples (Multi samples) this layer were grown to approximately 0.1 μm. On the S sample (Single sample) this layer constitute the $\alpha$-$Al_2O_3$-single layer.

An $\alpha$-$Al_2O_3$-multilayer was deposited on the MS samples and the M samples wherein a bonding sublayer of TiCO was alternated with a sublayer of $\alpha$-$Al_2O_3$. The TiCO sublayer was for all examples deposited for 75 seconds. It was deposited at 1000° C. and 60 mbar in a gas mixture of 1.7 vol % $TiCl_4$, 3.5 vol % CO, 4.3 vol % $AlCl_3$ and 90.5 vol % $H_2$. The $\alpha$-$Al_2O_3$ sublayer was deposited in two steps using identical process parameters as for the bottom $\alpha$-$Al_2O_3$ layer. The first step was performed for 2.5 minutes and the process time of the second step was about 3 minutes.

One period is equal to the sum of the thickness of one TiCO bonding sublayer and the thickness of one $\alpha$-$Al_2O_3$-sublayer. The measurement of the period in the $\alpha$-$Al_2O_3$-multilayers of the samples was made by dividing the total thickness of the $\alpha$-$Al_2O_3$-multilayer with the number of periods in the layer.

The thicknesses of the layers of the samples were studied in a light optical microscope and are shown on Table 2.

XRD Analyze Results

XRD analyses were made as disclosed in the method section above. No thin film correction was applied to the intensity data. The intensities of the peaks 110, 113, 024, 116, 0 0 12 and 0 1 14 originating from $\alpha$-$Al_2O_3$ for the samples are presented in Table 3 with the values normalized such that the intensity of 0 0 12 was set to 100%.

TABLE 3

XRD intensities originating from $\alpha$-$Al_2O_3$

| Sample | I(110) | I(113) | I(024) | I(116) | I(0 0 12) | I(0 1 14) |
|---|---|---|---|---|---|---|
| MS14 | 37 | 9 | 23 | 14 | 100 | 60 |
| MS23 | 43 | 8 | 31 | 17 | 100 | 62 |
| S5 | 74 | 5 | 16 | 6 | 100 | 53 |
| M5 | 65 | 4 | 19 | 11 | 100 | 45 |
| MS-2 | 48 | 7 | 19 | 12 | 100 | 67 |
| MS-4 | 61 | 5 | 16 | 9 | 100 | 48 |

As can be seen in Table 3, all the samples show a very high 0 0 12 peak intensity.

The TiCN layer located between the substrate and the $\alpha$-$Al_2O_3$-layers of the samples were studied in XRD. Since the same CVD deposition parameters were used on all samples, only the TC values from the S5 sample is presented below. Subsequent to thin film correction and correction for absorption in the single $\alpha$-$Al_2O_3$-layer of the data, the TC values were calculated using Harris formula. The TC values are shown in Table 4.

Harris Formula:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where I(hkl) is the measured intensity (integrated area) of the (hkl) reflection, $I_0$(hkl) is the standard intensity according to ICDD's PDF-card No. 42-1489, n is the number of reflections, reflections used in the calculation are (1 1 1), (2 0 0), (2 2 0), (3 1 1), (3 3 1), (4 2 0), (4 2 2) and (5 1 1).

TABLE 4

TC values of TiCN layer of sample S5

| h k l | TC(h k l) |
|---|---|
| 2 2 0 | 0.11 |
| 3 1 1 | 2.18 |
| 4 2 2 | 4.02 |

TABLE 2

Layer thicknesses

| Sample | TiN + TiCN + bonding layer [μm] | Multi $\alpha$-$Al_2O_3$ [μm] ($\alpha$-$Al_2O_3$ + TiCO)$_x$ | Period in multi$\alpha$-$Al_2O_3$ [nm] | Single $\alpha$-$Al_2O_3$ [μm] | Ratio of multilayer to total alumina layer thickness [%] | Total coating thickness [μm] |
|---|---|---|---|---|---|---|
| MS14 | 9.0 | 1.1 | 138 | 3.8 | 22 | 13.9 |
| MS23 | 8.9 | 2.1 | 140 | 3.0 | 41 | 14.0 |
| S5 | 8.5 | — | — | 5.1 | — | 13.6 |
| M5 | 8.5 | 4.8 | 123 | 0.1 | 98 | 13.4 |
| MS-2 | 8.4 | 0.3 | 135 | 4.5 | 6 | 13.2 |
| MS-4 | 8.8 | 0.5 | 125 | 4.2 | 11 | 13.5 |

XRD signal from the TiCO sublayers and signals from the TiCN layer is difficult to separate in analyzing the layers since both the TiCO and the TiCN are cubic with similar cell parameters. To analyze the TiCN layer the $\alpha$-$Al_2O_3$-multilayers should first be removed by mechanical or chemical means such as etching or polishing. Thereafter the TiCN layer can be analyzed.

Cutting Tests

The samples were evaluated in two different metal cutting tests. A blasting was performed on the rake faces of the coated cutting tools prior to the cutting tests. The blaster slurry used consisted of 20 vol-% alumina in water and an angle of 90 deg. between the rake face of the cutting insert and the direction of the blaster slurry. The pressure of the slurry to the gun was 2.2 bar for all wear tested samples.

PD Impression-Flank Wear

The samples were tested in a dry turning test cutting in work piece material SS2541 (a 700×180 mm bar). Face turning was applied on said bar from a diameter of 178 mm to a diameter of 60 mm. The following cutting data was used:

Cutting speed, $V_c$: 210 m/min
Feed, $f_n$: 0.35 mm/revolution
Cutting depth, $a_p$: 2 mm The stop criterion was defined as when the flank wear (Vb) ≥0.4 mm or at edge breakage. Each insert edge was inspected after each 5 cuts or each 3 cut and the flank wear on the main edge was measured. The number of cuts at Vb=0.4 mm (an interpolated value) is shown for 4 parallel tests 1-4 in Table 5.

TABLE 5

Results from PD impression-flank wear test

| Sample | Test 1 Number of cuts at Vb = 0.4 mm | Test 2 Number of cuts at Vb = 0.4 mm | Test 3 Number of cuts at Vb = 0.4 mm | Test 4 Number of cuts at Vb = 0.4 mm |
|---|---|---|---|---|
| S5 | 59 | 31 | 44 | 72 |
| MS-2 | 60 | 29 | — | — |
| MS-4 | 54 | 32 | — | — |
| MS14 | 68 | 40 | 68 | 92 |
| MS23 | 58 | 29 | 42 | 64 |
| M5 | — | — | 43 | 70 |

The different tests were made each at one occasion, and as can be seen the life time for one and the same sample varies between the tests. This might be due to differences in the work material. The trend within one and the same test was studied. It was concluded that the samples MS14 were the samples that did show the highest number of cuts before reaching a Vb of more than 0.4 mm in each test.

Crater Wear

The coated cutting tools as blasted in accordance with above were tested in longitudinal turning in ball bearing steel Ovako825B (100CrMo7-3) using the following cutting data;

Cutting speed $v_c$: 220 m/min
Cutting feed, $f_n$: 0.3 mm/revolution
Depth of cut, $a_p$: 2 mm
Insert style: CNMG120408-PM Water miscible metal working fluid was used.

One cutting edge per cutting tool was evaluated.

In analyzing the crater wear, the area of exposed substrate was measured using a light optical microscope.

In test 1 the cutting was performed to a total time of 30 minutes cutting and the area of exposed substrate are presented in the table 6.

In test 2, the life time of the tool was considered reached when the surface area of the exposed substrate exceeded 0.2. The wear of each cutting tool was evaluated after 10 minutes cutting in the light optical microscope. The cutting process was then continued with a measurement after 6 minutes and then after each 2 minutes run. Beside crater wear, flank wear was also observed, but did not in this test influence the tool life. The results are shown in Table 6.

TABLE 6

Results from crater wear test

| Sample | Test 1 Crater wear area after 30 min [mm$^2$] | Test 2 Tool life time (>0.2 mm$^2$ crater area) (minutes) |
|---|---|---|
| S5 | 0.03 | 43 |
| MS-2 | — | 37 |
| MS-4 | — | 42 |
| MS14 | 0 | 51 |
| MS23 | 0.14 | 38 |
| M5 | 0.14 | — |

It was concluded from Test 1 that the samples S5 and MS14 showed a higher resistance to crater wear as compared to the samples MS23 and M5. From Test 2 it was concluded that the inventive sample MS14 showed the best resistance to crater wear.

While the invention has been described in connection with various exemplary embodiments, it is to be understood that the invention is not to be limited to the disclosed exemplary embodiments, on the contrary, it is intended to cover various modifications and equivalent arrangements within the appended claims. Furthermore, it should be recognized that any disclosed form or embodiment of the invention may be incorporated in any other disclosed or described or suggested form or embodiment as a general matter of design choice. It is the intention, therefore, to be limited only as indicated by the scope of the appended claims appended hereto.

The invention claimed is:

1. A coated cutting tool comprising:
    a substrate; and
    a coating, the coating including
    an inner $\alpha$-$Al_2O_3$-multilayer and an outer $\alpha$-$Al_2O_3$-single-layer,
    wherein a thickness of the outer $\alpha$-$Al_2O_3$-single-layer is 1-10 μm,
    wherein a thickness of the inner $\alpha$-$Al_2O_3$-multilayer is less than or equal to 35% of a sum of the thickness of the inner $\alpha$-$Al_2O_3$-multilayer and the thickness of the outer $\alpha$-$Al_2O_3$-single-layer,
    wherein the inner $\alpha$-$Al_2O_3$-multilayer consists of alternating sublayers of $\alpha$-$Al_2O_3$ and sublayers of TiCO, TiCNO, AlTiCO or AlTiCNO, the inner $\alpha$-$Al_2O_3$-multilayer including at least 5 sublayers of $\alpha$-$Al_2O_3$, and
    wherein the thickness of the inner $\alpha$-$Al_2O_3$-multilayer is 12% to 35% of the sum of the thickness of the inner $\alpha$-$Al_2O_3$-multilayer and the thickness of the outer $\alpha$-$Al_2O_3$-single-layer.

2. The coated cutting tool according to claim 1, wherein the inner $\alpha$-$Al_2O_3$-multilayer is adjacent to the outer $\alpha$-$Al_2O_3$-single-layer.

3. The coated cutting tool according to claim 1, wherein the sum of the thickness of the inner α-Al$_2$O$_3$-multilayer and the outer α-Al$_2$O$_3$-single-layer is 2-16 µm.

4. The coated cutting tool according to claim 1, wherein a period in the inner α-Al$_2$O$_3$-multilayer is 50-900 nm, wherein one period is a sum of a thickness of one sublayer of α-Al$_2$O$_3$ and one sublayer of TiCO, TiCNO, AlTiCO or AlTiCNO.

5. The coated cutting tool according to claim 1, wherein the inner α-Al$_2$O$_3$-multilayer in combination with the outer α-Al$_2$O$_3$-single-layer exhibits an XRD diffraction over a θ-2θ scan of 20°-140°, wherein an intensity of the 0 0 12 diffraction peak (peak area), I(0 0 12), to intensities of the 1 1 3 diffraction peak (peak area), I(1 1 3), the 1 1 6 diffraction peak (peak area), I(1 1 6), and the 0 2 4 diffraction peak (peak area), I(0 2 4), is I(0 0 12)/I(1 1 3) >1, I(0 0 12)/I(1 1 6) >1 and I(0 0 12)/I(0 2 4) >1.

6. The coated cutting tool according to claim 5, wherein an intensity of the 0 1 14 diffraction peak (peak area), I(0 1 14), to the intensity of the 0 0 12 diffraction peak (peak area), I(0 0 12), is I(0 1 14)/I(0 0 12)<2.

7. The coated cutting tool according to claim 5, wherein a relation between the intensity of the 1 1 0 diffraction peak (peak area), I(1 1 0), and the intensities of the 1 1 3 diffraction peak (peak area), I(1 1 3), and the 0 2 4 diffraction peak (peak area), I(0 2 4), is I(110) >each of I(113) and I(024).

8. The coated cutting tool according to claim 5, wherein a relation between the intensity of the 0 0 12 diffraction peak (peak area), I(0 0 12), and the intensity of the 1 1 0 diffraction peak (peak area), I(1 1 0), is I(0 0 12) >I(110).

9. The coated cutting tool according to claim 1, further comprising at least one layer of TiC, TiN, TiAlN or TiCN located between the substrate and the inner α-Al$_2$O$_3$-multilayer.

10. The coated cutting tool according to claim 9, wherein a thickness of the TiC, TiN, TiAlN or TiCN layer is 2-15 µm.

11. The coated cutting tool according to claim 9, wherein the at least one layer of TiC, TiN, TiAlN or TiCN is a TiCN layer that exhibits an X-ray diffraction pattern, as measured using CuKα radiation and θ-2θ scan, wherein the TC(hkl) is defined according to Harris formula:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where I(hkl) is the measured intensity (integrated area) of the (hkl) reflection, I$_0$(hkl) is the standard intensity according to ICDD's PDF-card No. 42-1489, n is the number of reflections, reflections used in the calculation being (1 1 1), (2 0 0), (2 2 0), (3 1 1), (3 3 1), (4 2 0), (4 2 2) and (5 1 1), wherein TC(331)+TC(422)>5.

12. The coated cutting tool according to claim 1, wherein the outermost layer of the coating is said outer α-Al$_2$O$_3$-single-layer.

13. The coated cutting tool according to claim 1, wherein the substrate is selected from cemented carbide, cermet, ceramic, high speed steel and cBN.

14. The coated cutting tool according to claim 1, wherein the substrate is cemented carbide including 3-14 wt % Co and more than 50 wt % WC.

* * * * *